(12) United States Patent
Lee

(10) Patent No.: US 11,488,527 B2
(45) Date of Patent: Nov. 1, 2022

(54) DISPLAY DEVICE CAPABLE OF DISCHARGING RESIDUAL CHARGES

(71) Applicant: LG DISPLAY CO., LTD., Seoul (KR)

(72) Inventor: Jaeseung Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/553,184

(22) Filed: Dec. 16, 2021

(65) Prior Publication Data
US 2022/0199008 A1 Jun. 23, 2022

(30) Foreign Application Priority Data
Dec. 22, 2020 (KR) .................. 10-2020-0180521

(51) Int. Cl.
*G09G 3/3225* (2016.01)
*H01L 27/32* (2006.01)

(52) U.S. Cl.
CPC ....... *G09G 3/3225* (2013.01); *H01L 27/3244* (2013.01); *G09G 2310/0251* (2013.01)

(58) Field of Classification Search
CPC .. G09G 3/3258; G09G 3/3648; G09G 3/3696; G09G 2330/02; G09G 2320/0257; G09G 2310/08; G09G 2310/0267; G09G 2310/063
See application file for complete search history.

(56) References Cited

U.S. PATENT DOCUMENTS

| | | | | |
|---|---|---|---|---|
| 5,587,683 A | * | 12/1996 | Kawasaki | G09G 3/36 327/121 |
| 2001/0015709 A1 | * | 8/2001 | Imajo | G02F 1/13452 349/98 |
| 2004/0095081 A1 | * | 5/2004 | Kernahan | H05B 41/3927 315/307 |
| 2008/0106557 A1 | * | 5/2008 | Sayama | B41J 2/04596 29/890.1 |
| 2016/0189624 A1 | * | 6/2016 | Jang | G09G 3/20 345/99 |

FOREIGN PATENT DOCUMENTS

| KR | 10-0818125 B1 | 3/2008 |
|---|---|---|
| KR | 10-2156768 B1 | 7/2015 |

* cited by examiner

*Primary Examiner* — Shaheda A Abdin
(74) *Attorney, Agent, or Firm* — Polsinelli PC

(57) ABSTRACT

A display device capable of discharging residual charges includes a discharging circuitry to discharge charges remaining in a GIP driver, a Gate D-IC, a Source D-IC, a Gamma IC, etc. to a ground GND when a display panel is powered off, so that the display device protects the display panel by rapidly discharging residual charges that may accumulate on the display panel and a printed circuit board when power is off.

7 Claims, 9 Drawing Sheets

DISPLAY DEVICE CAPABLE OF DISCHARGING RESIDUAL CHARGES

CROSS-REFERENCE TO RELATED APPLICATION

This application claims a benefit under 35 U.S.C. § 119(a) of Korean Patent Application No. 10-2020-0180521 filed on Dec. 22, 2020, which is hereby incorporated by reference in its entirety for all purposes.

BACKGROUND

Field of the Disclosure

The present disclosure relates to a display device capable of discharging residual charges when a display panel is powered off.

Description of the Background

As the information society develops, the demand for display devices that display images is increasing. Various types of display devices including a liquid crystal display device (LCD), and an organic light emitting diode display device (OLED) are being used.

An active matrix driving type liquid crystal display device includes a thin-film transistor (TFT) as a switching element in each pixel.

An electroluminescent display device using an organic light emitting diode (OLED) includes a self-luminous element that emits light. The self-luminous element includes an organic light-emitting layer in which recombination between electrons and holes occurs. Thus, the electroluminescent display device has high luminance, low operation voltage, and may be embodied as an ultra-thin film device, and may be deformed into various shapes.

These display devices include a display panel that displays an image using a sub-pixel array, a driver circuit that operates the display panel, a timing controller that controls an operation timing of the driver circuit, and a power management integrated circuit (PMIC) that generates power necessary for the operation of the display panel.

When driving power is supplied to the display panel and then the display panel is powered off, residual charges remain in each pixel that displays the image, and the driver circuit. Thus, deterioration of the device may occur due to these residual charges, resulting in a shortened lifespan.

Therefore, there is a need to discharge the charges remaining in each pixel and the driver circuit when the display panel is powered off.

SUMMARY

Accordingly, the present disclosure is to provide a display device capable of discharging residual charges remaining in a gate driver, a data driver, and a gamma voltage generator to a ground when the display panel is powered off.

The present disclosure is not limited to the above-mentioned features. Other features and advantages in accordance with the present disclosure not mentioned above may be understood from following descriptions and more clearly understood from aspects in accordance with the present disclosure. Further, it will be readily appreciated that the purposes and advantages in accordance with the present disclosure may be realized by features and combinations thereof as disclosed in the claims.

In a display device capable of discharging residual charges according to one aspect of the present disclosure, a first discharging circuitry may be connected to and disposed between a boost converter of a power supply and a level shifter of a GIP (gate in panel) driver. Thus, charges remaining in the level shifter of the GIP driver when the display panel is powered off may be discharged through the first discharging circuitry.

In a display device capable of discharging residual charges according to one aspect of the present disclosure, a second discharging circuitry may be connected to and disposed between the power supply and the gate driver. Thus, charges remaining in the gate driver when the display panel is powered off may be discharged through the second discharging circuitry.

In a display device capable of discharging residual charges according to one aspect of the present disclosure, a third discharging circuitry may be connected to and disposed between the buck converter of the power supply and a source driver IC of the data driver. Thus, charges remaining in the source driver IC when the display panel is powered off may be discharged through the third discharging circuitry.

Further, in a display device capable of discharging residual charges according to one aspect of the present disclosure, a fourth discharging circuitry may be connected to and disposed between a buck converter of the power supply and a gamma voltage generator. Thus, charges remaining in the gamma voltage generator when the display panel is powered off may be discharged through the fourth discharging circuitry.

According to an aspect of the present disclosure, a discharging control signal application line is added to a portion of the display device from which the residual charges may be discharged. The TFT and the resistor may be added to the portion. Thus, a discharging circuit may be separately applied to a voltage source. Thus, a time required for discharging the charges remaining on the display panel may be secured, and the charges may be quickly discharged from individual voltage sources.

Therefore, there is an effect of protecting a display panel by rapidly discharging the residual charges that may accumulate on the panel and the printed circuit board (PCB) during the power off.

Further, according to an aspect of the present disclosure, the charges may be rapidly discharged from a voltage source applying a panel driving voltage on the PCB and driving integrated circuit(D-IC), thereby optimizing the panel driving voltage and charge discharging, thereby stably operating the panel during the power on/off.

Further, according to an aspect of the present disclosure, the panel discharging time may be freely changed by adjusting a resistor value of a resistor connected to and disposed between a gate high voltage VGH Rail and a discharging switch without increasing additional capacitance. Thus, a cost may be saved.

Further, according to an aspect of the present disclosure, as a falling time of the driving voltage VDD of the source driving integrated circuit (source D-IC) is shorter when the panel power is off, the panel discharging may be effectively performed. Thus, the resistor value of the resistor between the VDD Rail and the discharging switch S/W may be reduced such that the falling time (VDD falling time) of the driving voltage VDD of the source driving integrated circuit (source D-IC) may be minimized, thereby maximizing the panel discharging effect.

Further, according to an aspect of the present disclosure, the falling times of not only the driving voltage VDD of the source driving integrated circuit (source D-IC) but also the remaining driving voltage HVDD/GMA of the source driving integrated circuit (source D-IC) and the panel off voltage may be freely adjusted only by changing the resistor value as needed. Thus, the discharging time may be freely set. Thus, the panel discharging circuit may be optimized, and the display panel may operate stably during panel on/off.

In addition to the effects as described above, specific effects in accordance with the present disclosure will be described together with following detailed descriptions for carrying out the disclosure.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
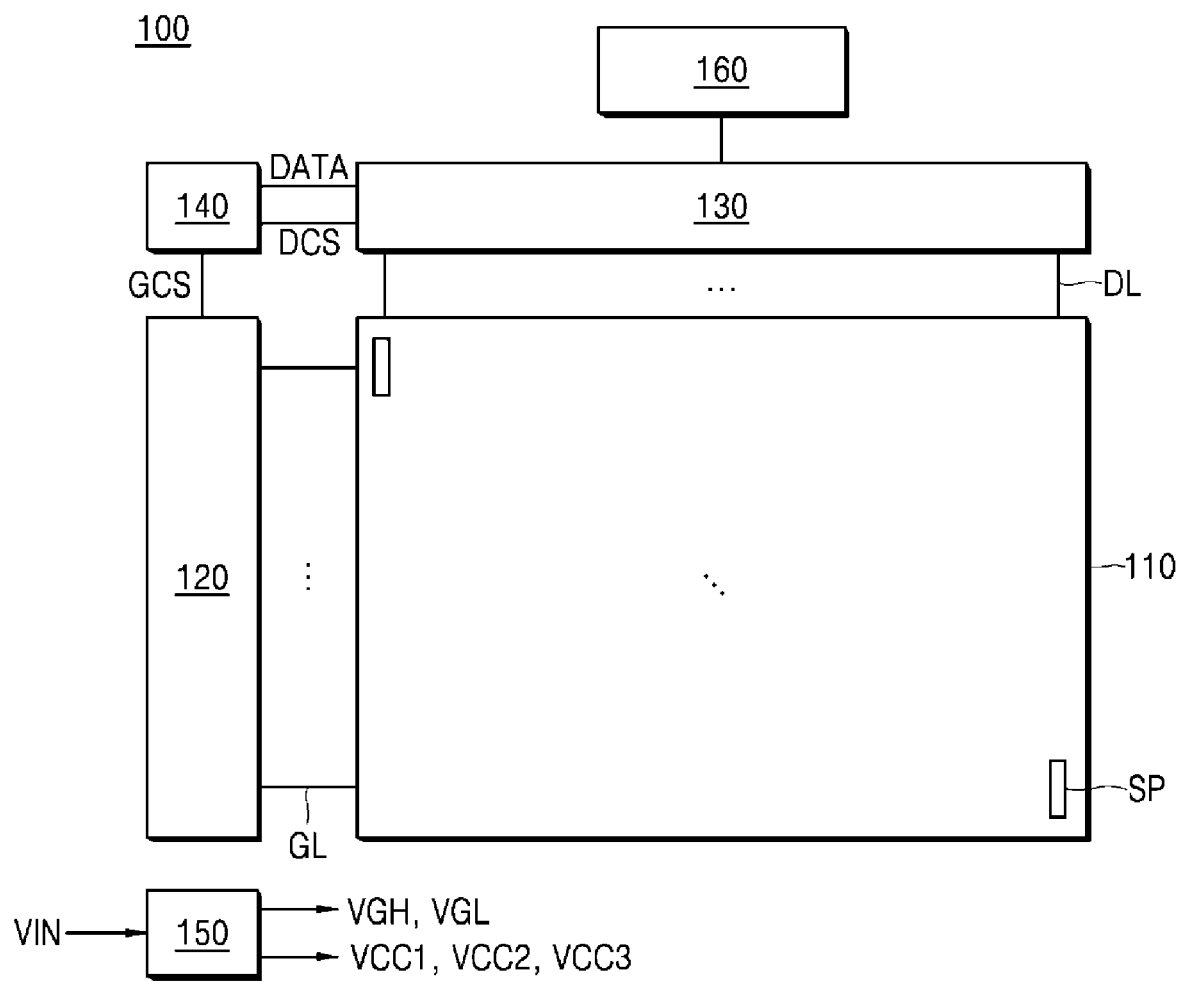
FIG. 1 is a drawing showing a display device capable of discharging residual charges according to an aspect of the present disclosure.

For simplicity and clarity of illustration, elements in the figures are not necessarily drawn to scale. The same reference numbers in different figures represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various aspects are illustrated and described further below. It will be understood that the description herein is not intended to limit the claims to the specific aspects described. On the contrary, it is intended to cover alternatives, modifications, and equivalents as may be included within the spirit and scope of the present disclosure as defined by the appended claims.

A shape, a size, a ratio, an angle, a number, etc. disclosed in the drawings for describing an aspects of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular aspects only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entirety of list of elements and may not modify the individual elements of the list. When referring to "C to D", this means C inclusive to D inclusive unless otherwise specified.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one example, when a certain aspect may be implemented differently, a function or operation specified in a specific block may occur in a sequence different from that specified in a flowchart. For example, two consecutive blocks may actually be executed at the same time. Depending on a related function or operation, the blocks may be executed in a reverse sequence.

In descriptions of temporal relationships, for example, temporal precedent relationships between two events such as "after", "subsequent to", "before", etc., another event may occur therebetween unless "directly after", "directly subsequent" or "directly before" is not indicated.

The features of the various aspects of the present disclosure may be partially or entirely combined with each other, and may be technically associated with each other or operate with each other. The aspects may be implemented independently of each other and may be implemented together in an association relationship.

Spatially relative terms, such as "beneath," "below," "lower," "under," "above," "upper," and the like, may be used herein for ease of explanation to describe one element or feature's relationship to another element or feature as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented for example, rotated 90 degrees or at other orientations, and the spatially relative descriptors used herein should be interpreted accordingly.

"X axis direction", "Y axis direction" and "Z axis direction" should not be interpreted only to have a geometric relationship in which the X axis direction, the Y axis direction, and the Z axis direction are perpendicular to each other. "X axis direction", "Y axis direction" and "Z axis direction" may be interpreted to have a broader direction within a range in which components herein may work functionally.

Hereinafter, a display device capable of discharging residual charges according to an aspect of the present disclosure will be described.

Figure 2:
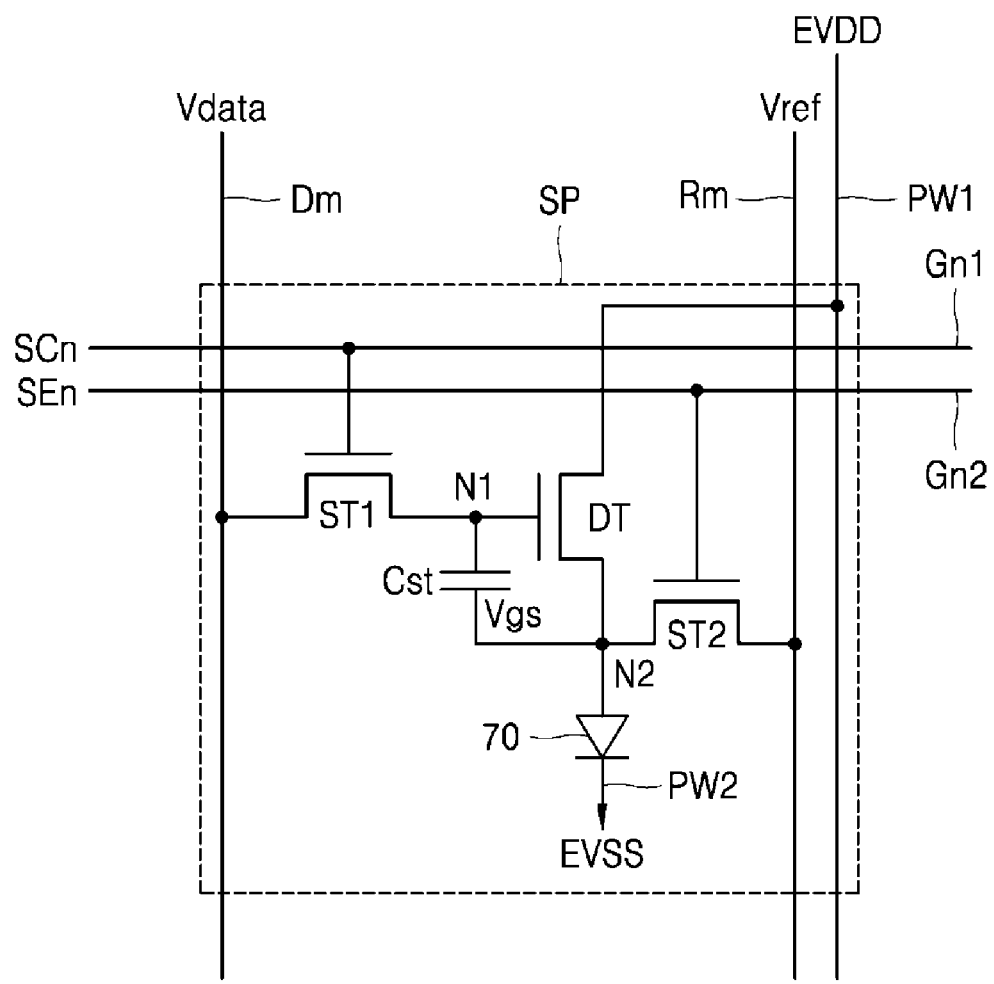
FIG. 2 is an equivalent circuit diagram illustrating a configuration of one sub-pixel in the display device shown in FIG. 1.

FIG. 1 is a drawing showing a display device capable of discharging residual charges according to an aspect of the present disclosure. FIG. 2 is an equivalent circuit diagram illustrating a configuration of one sub-pixel in the display device shown in FIG. 1.

Referring to FIG. 1 and FIG. 2, a display device 100 capable of discharging residual charges according to an aspect of the present disclosure may include a display panel 110, a gate driver 120, a data driver 130, a timing controller 140, a power supply 150 and a gamma voltage generator 160.

The display panel 110 may include a plurality of gate lines GL, a plurality of data lines DL, and a plurality of sub-pixels SP. That is, a number of gate lines GL and a number of data lines DL may be arranged on the display panel 110. A sub-pixel SP may be disposed at each of intersections between the gate lines GL and the data lines DL. For example, in an organic light-emitting display device having a resolution of 2,160 x 3,840, 2,160 gate lines GL and 3,840 data lines DL may be provided. Each sub-pixel SP may be positioned at each of intersections between the gate lines GL and the data lines DL.

In an liquid crystal display device (LCD), the display panel 110 may be composed of an upper glass substrate and a lower glass substrate facing away each other, and a liquid crystal layer interposed therebetween. In this connection, on the lower glass substrate, a number of sub-pixel SPs are respectively arranged at the intersections between the data lines DL and the gate lines GL. A black matrix, a color filter, and a common electrode may be formed on the upper glass substrate. The common electrode may be formed on the upper glass substrate in a vertical electric field driving scheme such as TN (Twisted Nematic) mode, VA (Vertical Alignment) mode, etc. In a horizontal electric field driving scheme such as IPS (In Plane Switching) mode and FFS (Fringe Field Switching) mode, the common electrode and the sub-pixels SP may be formed on the lower glass substrate. Further, a polarizing plate may be attached to each of the upper glass substrate and the lower glass substrate of the display panel 110. An alignment layer for setting a pre-tilt angle of the liquid crystal may be formed on each of the upper glass substrate and the lower glass substrate.

The sub-pixels SP may be arranged in a matrix form and on the display panel 110 in one example. The sub-pixel SP may refer to an unit in which a specific type of a color filter is formed or a unit in which the color filter is not formed but an organic light-emissive element emits a special color.

The display panel 110 may display an image using a pixel array. The display panel 110 may employ one of various pixel structures. A basic pixel of the pixel array may be composed of sub-pixels of 2, 3 or 4 colors among white W, red R, green G, and blue B.

Each sub-pixel SP may display one of the first to third colors. In an aspect of the present disclosure, each sub-pixel SP may display one color of red R, green G, and blue B. In another aspect, each sub-pixel SP may display at least one color of cyan, magenta, and yellow. In various aspects, the sub-pixel SP may be configured to display one or more of four or more colors. For example, each sub-pixel SP may display at least one color of red R, green G, blue B, and white W.

In the display panel 110, the plurality of data lines DL and the plurality of gate lines GL may be arranged. Each sub-pixel SP may be electrically connected to corresponding one of the gate lines GL and corresponding one of the data lines DL. The sub-pixel SP may emit light at luminance corresponding to a gate signal and a data signal supplied through the gate lines GL and the data lines DL.

In one example, the display panel 110 may include a touch panel TP having a touch sensor embedded therein or attached thereto. The touch panel may be disposed on a top or bottom face of the display panel 110, and may include a plurality of touch electrodes.

In FIG. 2, each sub-pixel SP may include an OLED element 70 connected to and disposed between a high potential drive voltage (first drive voltage; EVDD) line PW1 and a low potential drive voltage (second drive voltage; EVSS) line PW2, and a pixel circuit including at least first and second switching TFTs ST1 and ST2, a driving TFT DT, and a storage capacitor Cst to independently drive the OLED element 70. In one example, the pixel circuit may have various configurations other than the configuration in FIG. 2.

Each of the switching TFTs ST1 and ST2, and the driving TFT DT may be embodied as an amorphous silicon (a-Si) TFT, a poly-silicon (poly-Si) TFT, an oxide TFT, an organic TFT, or the like.

The OLED element 70 may have an anode connected to a source node N2 of the driving TFT DT, a cathode connected to the EVSS line PW2, and an organic light-emitting layer between the anode and the cathode. Each anode may correspond to each sub-pixel, while the cathode may be a common electrode shared by all sub-pixels. When driving current is supplied from the driving TFT DT to the OLED element 70, electrons from the cathode are injected into the organic light-emitting layer, while holes from the anode are injected into the organic light-emitting layer. Then, a fluorescent or phosphorescent material emits light via recombination of electrons and holes in the organic light-emitting layer. Thus, the OLED element 70 generates light at brightness proportional to a current value of the driving current.

The first switching TFT ST1 may be activated through a scan pulse SCn supplied from the gate driver 120 to the gate line Gn1 and thus may supply a data voltage Vdata supplied from the data driver 130 to the data line Dm to a gate node N1 of the driving TFT DT.

The second switching TFT ST2 may be activated through a sense pulse SEn supplied from the gate driver 120 to another gate line Gn2, and thus may supply a reference voltage Vref supplied from the data driver 130 to a reference line Rm to a source node N2 of the driving TFT DT.

The storage capacitor Cst connected to and disposed between the gate node N1 and the source node N2 of the driving TFT DT may charge therein a difference between the data voltage Vdata and the reference voltage Vref respectively supplied to the gate node N1 and the source node N2 through the first and second switching TFTs ST1 and ST2, respectively, as a driving voltage Vgs of the driving TFT DT. Then, during the light-emitting period when the first and second switching TFTs ST1 and ST2 are off, the storage capacitor Cst may hold the driving voltage Vgs as charged therein.

The driving TFT DT controls a current supplied from the EVDD line PW1 based on the driving voltage Vgs supplied from the storage capacitor Cst, and thus supplies a driving current determined based on the driving voltage Vgs to the OLED element 70, such that the OLED element 70 emits light.

In one example, in a sensing mode of the sub-pixel SP, the driving TFT DT may be activated upon receiving a sensing data voltage Vdata supplied through the data line Dm and the first switching TFT ST1, and a reference voltage Vref supplied through the reference line Rm and the second switching TFT ST2. A pixel current representing the electric characteristic (Vth, mobility) of the driving TFT DT may be charged into a line capacitor of the reference line Rm in a floating state through the second switching TFT ST2 and thus a corresponding voltage may be charged into the line capacitor. The data driver 130 samples the voltage charged into the reference line Rm, converts the sampled voltage into sensing data of each sub-pixel SP, and outputs the converted data to the timing controller 140. Hereinafter, the sub-pixel SP is simply referred to as a 'pixel PX'.

The gate driver 120 and the data driver 130 shown in FIG. 1 may be referred to as a 'panel driver' or a 'driver' that drives the display panel 110.

Therefore, the driver that transmits a driving signal to the display panel 110 may include the gate driver 120 and the data driver 130.

The gate driver 120 may activate the plurality of gate lines GL. For example, the gate driver 120 may sequentially supply a scan signal to the plurality of gate lines. Thus, the plurality of gate lines may be activated sequentially.

The gate driver 120 may sequentially drive the plurality of gate lines GL by sequentially supplying a scan signal of an on voltage or an off voltage to the plurality of gate lines GL under the control of the timing controller 140. That is, the gate driver 120 may be controlled by the timing controller 140 and may control an operation timing of each of the multiple sub-pixels SP by sequentially outputting a scan signal to the plurality of gate line GL arranged on the display panel 110. In an organic light-emitting display device having a resolution of 2,160 x 3,840, the gate driver 120 may sequentially output the scan signal to a first gate line to a 2160-th gate line . This may be referred to as a 2,160 phase driving. Alternatively, the gate driver 120 may sequentially output the scan signal to a first gate line to a fourth gate line, and then sequentially output the scan signal to a 5th gate line to a 8th gate line, and so on. That, the gate driver 120 may sequentially output the scan signal on a 4 gate lines basis. This may be referred to as a 4-phase driving. That is, a scheme in which the gate driver sequentially output the scan signal on a N gate lines basis may be referred to as a N-phase driving scheme.

Further, the gate driver 120 may be located only on one side of the display panel 110, as shown in FIG. 1, depending on the driving scheme or the design of the display panel 110. In some cases, the gate driver 120 may be located on each of both opposing sides thereof.

The gate driver 120 may be connected to each pixel PX of the display panel 110 through each of the plurality of gate lines GL. The gate driver 120 may generate gate signals based on a gate driving control signal GCS output from the timing controller 140. The gate driver 120 may provide the generated gate signals to each pixel PX through each of the plurality of gate lines GL.

The gate driver 120 according to one aspect may be composed of one or a plurality of gate ICs (Integrated Circuit). The plurality of gate ICs may be individually mounted on a circuit film in a COF (Chip On Film) manner which may, in turn, be bonded and connected to the display panel 110 in a TAB (Tape Automatic Bonding) scheme. Alternatively, the plurality of gate ICs may be mounted on the display panel 110 in a COG (Chip On Glass) scheme.

Further, the gate driver 120 may include at least one gate driver integrated circuit (GDIC). In another example, each gate driver integrated circuit may be integrated onto the display panel 110.

In one example, the gate driver 120 according to one aspect together with a thin-film transistor array constituting the pixel array of the display panel 110 may be formed on the substrate, and thus may be built in a non-display area on each of both opposing sides or one side of the display panel 110 in a GIP (gate in panel) manner. For example, in FIG. 1, the gate driver 120 and the data driver 130 are shown as separate components from the display panel 110. However, the present disclosure is not limited thereto. At least one of the gate driver 120 or the data driver 130 may be built in a bezel area and may be formed integrally with the display panel 110 in the GIP (Gate In Panel) scheme.

The data driver 130 may activate the plurality of data lines DL. For example, when a specific gate line GL is turned on, the data driver 130 converts the image data received from the timing controller 140 into an analog data voltage and supplies the latter to the plurality of data lines DL, and thus may activate the plurality of data lines DL.

The data driver 30 may be connected to each pixel PX of the display panel 110 through each of the plurality of data lines DL. The data driver 130 may generate data signals based on image data DATA and a data driving control signal DCS output from the timing controller 140. The data driver 130 may provide the generated data signals to each pixel PX through each of the plurality of data lines DL.

For example, the data driver 130 converts digital data into an analog data signal using gray level voltages corresponding to a plurality of reference gamma voltages GMA supplied from the gamma voltage generator 160 and supplies the analog data signal to the display panel 110 through the data lines.

The data driver 130 may supply the reference voltage Vref to the reference line Rm of the display panel 110 under the control of the timing controller 140.

When the data driver 130 is in a sensing mode under the control of the timing controller 140, the data driver 130 supplies a sensing data voltage to the data line to drive each sub-pixel. The data driver 130 may sense a pixel current representing the electrical characteristics of the activated sub-pixel through the reference line Rm and may convert the sensed pixel current into digital sensing data and may provide the digital sensing data to the timing controller 140.

The data driver 130 maybe composed of a plurality of data ICs. The plurality of data ICs may be individually mounted on a circuit film in a COF (Chip On Film) manner which may, in turn, be bonded and connected to the display panel 110 in a TAB (Tape Automatic Bonding) scheme. Alternatively, the plurality of data ICs may be mounted on the display panel 110 in a COG (Chip On Glass) scheme.

The data driver 130 may include at least one source driver integrated circuit (SDIC) to activate the plurality of data lines.

Each source driver integrated circuit (SDIC) may be connected to a bonding pad of the display panel 110 in a TAB (Tape Automated Bonding) scheme, or may be directly disposed on the display panel 110 in a chip-on glass (COG) scheme. In another example, each source driver integrated circuit (SDIC) may be integrated into the display panel 110.

Further, each source driver integrated circuit (SDIC) may be implemented in a chip-on-film (COF) scheme. In this case, each source driver integrated circuit (SDIC) may be mounted on a circuit film and may be electrically connected to the data line DL of the display panel 110 through the circuit film.

A source driver chip corresponding to each source driver integrated circuit (SDIC) may be mounted on a flexible film. One side of the flexible film may be bonded to at least one source printed circuit board, while the opposite side thereof may be bonded to the display panel 110.

The source printed circuit board may be connected to a control printed circuit board through a connection medium such as a flexible flat cable (FFC) or a flexible printed circuit (FPC). The timing controller 140 may be disposed on the control printed circuit board.

Further, the power supply 150 such as a power management integrated circuit(PMIC) that supplies voltage or current to the display panel 110, the gate driver 120, and the data driver 130, or controls the voltage or current to be supplied may be further disposed on the control printed circuit board. The source printed circuit board and the control printed circuit board as mentioned above may be integrated into a single printed circuit board.

The timing controller 140 may receive a source image and timing control signals from a host system. The host system may be one of a computer, a TV system, a set-top box, a portable terminal such as a tablet or a mobile phone. The timing control signals may include a dot clock, a data enable signal, a vertical sync signal, a horizontal sync signal, etc.

The timing controller 140 may control the gate driver 120 and the data driver 130 based on an image signal and a control signal received from an external system. The image signal may include a plurality of gray level data. The control signal may include, for example, a vertical synchronization signal, a horizontal synchronization signal, a data enable signal, a clock signal, etc.

The timing controller 140 may implement the image signal and the control signal based on an operating condition of the display panel 110, and thus may generate and output the image data DATA, the gate driving control signal GCS, the data driving control signal DCS, and a power supply control signal.

The timing controller 140 may control the gate driver 120 and the data driver 130 by supplying the control signals to the gate driver 120 and the data driver 130. This timing controller 140 may start a scanning operation according to a timing implemented in each frame, and may convert input image data input from an external system to match a data signal format used by the data driver 130, and may output the converted image data and may control data activation at an appropriate time based on the scan result.

For example, in order to control the gate driver 120, the timing controller 140 may output various gate driving control signals GCS including a gate start pulse, a gate shift clock, and a gate output enable signal.

In this connection, the gate start pulse controls a timing at which at least one gate driver integrated circuit (GDIC) constituting the gate driver 120 starts operation. Further, the gate shift clock may refer to a clock signal commonly input to the at least one gate driver integrated circuit (GDIC), and may control a shift timing of the scan signal. Further, the gate output enable signal specifies timing information of the at least one gate driver integrated circuit (GDIC).

Further, in order to control the data driver 130, the timing controller 140 outputs various data driving control signals DCS including a source start pulse, a source sampling clock, and a source output enable signal.

In this connection, the source start pulse controls a timing at which the at least one source driver integrated circuit (SDIC) constituting the data driver 130 starts data sampling. The source sampling clock may refer to a clock signal that controls a timing at which the source driver integrated circuit (SDIC) samples data. The source output enable signal controls an output timing of the data driver 130.

The power supply 150 may generate power required for the operation of the display panel 110. That is, the power supply 150 may supply various voltages or currents to the display panel 110, the gate driver 120, the data driver 130, etc. For example, the power supply 150 may generate power required for an operation of the pixel array of the display panel 110 and an operation of each of the gate driver 120 and the data driver 130 using a DC-DC converter. The DC-DC converter may include a charge pump, a regulator, a buck converter, and a boost converter.

The power supply 150 may adjust a DC input voltage from the host system to generate DC power such as a gamma reference voltage, a gate high voltage VGH, a gate low voltage VGL, a high potential drive voltage EVDD, a low potential drive voltage EVSS, and an initialization voltage. The gamma reference voltage may be supplied to the gamma voltage generator 160. The gate low voltage VGL and the gate high voltage VGH may be supplied to the level shifter 330 of the gate driver 120. Pixel power such as the high potential drive voltage EVDD, the low potential drive voltage EVSS, and the initialization voltage may be commonly supplied to each pixel PX.

The power supply 150 may be implemented as a PMIC (power management integrated circuit) that controls various voltages or currents to be supplied. In a following aspect, the power supply 150 will be referred to as the 'PMIC 150'.

The PMIC 150 may supply various voltages or currents including driving voltages to the display panel 110, the gate driver 120, the data driver 130, and the like or may control the voltages or currents to be supplied thereto.

The PMIC 150 starts to operate when an input power VIN supplied from the host system is higher than an UVLO (Under Voltage Lock Out) level. The PMIC 150 may generate an output signal after a predefined time is delayed. The output signal of the PMIC 150 may include the gate high voltage VGH, the gate low voltage VGL, a plurality of buck voltages VCC1, VCC2, and VCC3, and a boost voltage.

The gate high voltage VGH refers to a voltage set to be higher or equal to a threshold voltage of each of the transistors formed in the sub-pixel (SP) array. The gate low voltage VGL may be set to a voltage lower than the threshold voltage of each of the transistors formed in the sub-pixel (SP) array. The gate high voltage VGH and the gate low voltage VGL are supplied to the gate driver 120.

Further, the PMIC 150 may include a boost converter for supplying an output voltage of a level higher than that of an input voltage, and a buck converter for supplying an output voltage of a level lower than that of an input voltage. Each of the boost converter and the buck converter may be mounted in a SOC (System on Chip) manner. Alternatively, the boost converter and the buck converter may be mounted outside the PMIC 150.

Further, a first buck voltage VCC1 among the plurality of buck voltages VCC1, VCC2, and VCC3 for stepping down an input power VIN of the PMIC 150 may act as a first logic voltage for operating the timing controller 140 or other control circuits, and may be in a range of 1 V to 1.2 V. Similarly, the second buck voltage VCC2 may have a different level than that of the first buck voltage VCC1, and may act as a second logic voltage for operating a driver circuit including the data driver 130, and may be in a range of 1.7 V to 1.9 V. Further, the third buck voltage VCC3 may have a different level from that of each of the first buck voltage VCC1 and the second buck voltage VCC2, and may act as a third logic voltage for driving a memory such as EEPROM (Electrically Erasable Programmable Read-Only Memory), and may have a value in a range of 3.2 V to 3.4 V.

In an aspect of the present disclosure, an output order and voltage levels of the buck voltages output from the buck converter of the PMIC 150 may be recorded in a built-in memory at a time of an initial production of the device. To change the output order and the voltage level, power may be applied the PMIC 150 which then may change the output order and the voltage levels recorded in the memory using a communication protocol of an I2C (Inter-Integrated Circuit) scheme.

The buck voltages VCC1, VCC2, and VCC3 used in the display device 100 capable of discharging the residual charges according to an aspect of the present disclosure may respectively have 1 V to 1.2 V, 1.7 V to 1.9 V, and 3.2 V to 3.4 V as mentioned above. However, the present disclosure is not limited thereto. Depending on a type of the display device, the voltage levels and the supply sequence thereof may vary.

The gamma voltage generator 160 may generate a reference gamma voltage set including a plurality of reference gamma voltages having different voltage levels and supply the set to the data driver 130. The gamma voltage generator 160 may adjust a reference gamma voltage level under the control of the timing controller 140.

In one example, the timing controller 140 may apply a compensation value for a characteristic deviation of each sub-pixel as stored in the memory to remove the deviation. In the sensing mode, the timing controller 140 may sense the electrical characteristics (Vth and mobility of the driving TFT, and Vth of the OLED) of each sub-pixel of the display panel 110 through the data driver 130, and then may use the sensing result to update the compensation value related to each sub-pixel as recorded in the memory.

Figure 3:
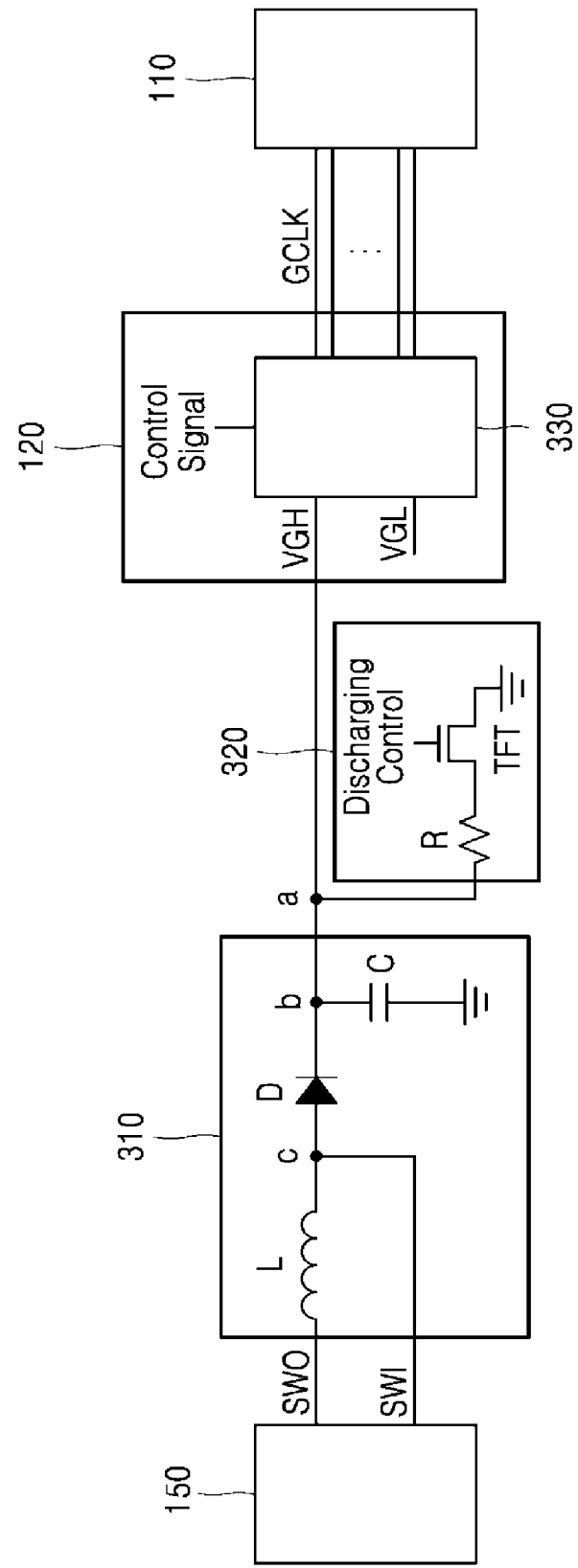
FIG. 3 is a schematic diagram showing a configuration of a display device capable of discharging residual charges according to a first aspect of the present disclosure.

FIG. 3 is a schematic diagram showing a configuration of a display device capable of discharging residual charges according to a first aspect of the present disclosure.

Referring to FIG. 3, a display device 100 capable of discharging residual charges according to the first aspect of the present disclosure may include a display panel 110, the gate driver 120, the power supply 150, the boost converter 310 and a first discharging circuitry 320.

In this connection, each of the display panel 110 and the power supply 150 has the same configuration and function as that as described in FIG. 1. Thus, descriptions thereof are omitted.

The gate driver 120 may include a level shifter 330 and a GIP (Gate In Panel) unit.

The boost converter 310 may supply an output voltage of a higher level than that of the input voltage of the power generated from the power supply 150. For example, the boost converter 310 may boost an output voltage (e.g., 12 V) output from the PMIC 150 to 28 V, and output the boosted voltage as the gate high voltage VGH to the level shifter 330.

The boost converter 310 may be configured to include an inductance L, a diode D, and a capacitor C. In the boost converter 310, for example, the inductance L and the diode D may be connected in series to and disposed between a SWO terminal of the PMIC 150 and a VGH terminal of the level shifter 330. The capacitor C may be connected in parallel to and disposed between a connection point b between the diode D and the VGH terminal and a ground. A SWI terminal of the PMIC 150 may be connected to a connection point c between the inductance L and the diode D.

The first discharging circuitry 320 may be connected to and disposed between the level shifter 330 and the boost converter 310 to discharge charges remaining in the level shifter 330 to the ground when the display panel 110 is powered off.

The level shifter 330 may output a gate clock GCLK switching between the gate high voltage VGH and the gate low voltage VGL according to a clock signal provided from the timing controller 140. That is, the level shifter 330 may generate a gate clock GCLK upon receiving first and second reference clocks and a start clock from the timing controller 140.

The GIP unit may generate gate pulses based on the gate clocks GCLK output from the level shifter 330 and output the gate pulses to the plurality of gate lines.

The level shifter 330 includes a number of stages that are connected to each other in a mutually-dependent manner. The stages may sequentially output gate clocks of different phases. The level shifter 330 may select the number of gate clock GCLK phases in a varying manner.

The first discharging circuitry 320 may include a resistor R connected to a connection point a between the level shifter 330 and the boost converter 310, and a thin-film transistor TFT having a drain terminal connected to the resistor R and a source terminal connected to the ground.

Therefore, when the power of the display panel 110 is off, the thin-film transistor TFT of the first discharging circuitry 320 is turned on when a discharging control signal is applied to a gate terminal thereof. Thus, the gate high voltage VGH signal remaining in the level shifter 330 may flow to the ground GND through the resistor R, the drain terminal and the source terminal and thus may be discharged. In other words, residual charges charged in a capacitor on the VGH rail may flow through the resistor R of the first discharging circuitry 320 to the ground GND.

In this connection, a falling time of the first discharging circuitry 320 may be determined based on the resistor R value. A turned-on time (discharging time) for the gate terminal of the thin-film transistor TFT may be determined based on the falling time.

A timing when the display panel 110 is powered off may mean a timing when a main controller disposed in the printed circuit board PCB receives a power off signal from the system. The main controller generates the discharging control signal, based on the power off signal, for a certain period of time, and applies the discharging control signal to the thin-film transistor TFT of the first discharging circuitry 320.

In one example, when the power of the display panel 110 is on, the thin-film transistor TFT of the first discharging circuitry 320 is turned off because the discharging control signal is not applied to the gate terminal thereof. Thus, the gate high voltage VGH signal from the boost converter 310 is input to the level shifter 330.

The first discharging circuitry 320 may increase or decrease the discharging time based on a magnitude of the resistor R value. In this connection, the magnitude of the resistor value may be adjusted by the main controller or an engineer in consideration of a Factor of safety(FOS) of the display panel 110 or a minimum discharging time as required.

Moreover, when the power of display panel 110 is off, the charges remaining on each pixel PX of the display panel 110 may flow to the ground GND connected to each pixel and be discharged.

Figure 4:
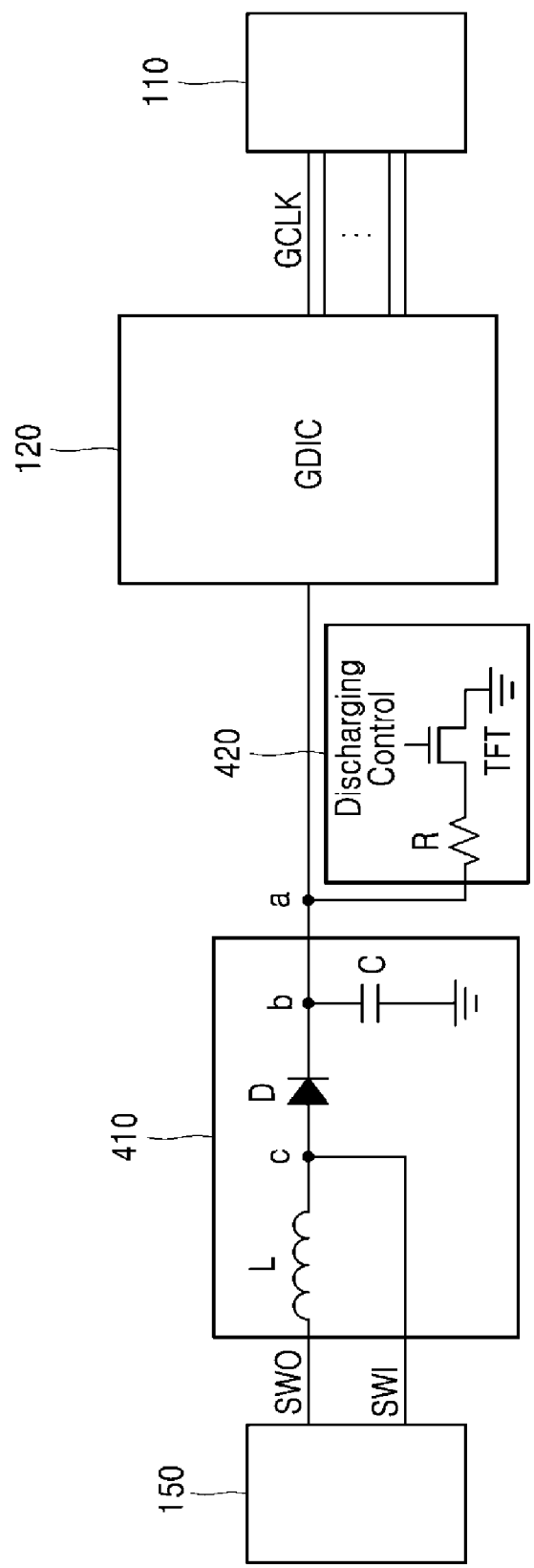
FIG. 4 is a schematic diagram showing a configuration of a display device capable of discharging residual charges according to a second aspect of the present disclosure.

FIG. 4 is a schematic diagram showing a configuration of a display device capable of discharging residual charges according to a second aspect of the present disclosure.

Referring to FIG. 4, a display device 100 capable of discharging residual charges according to the second aspect of the present disclosure may include the display panel 110, the gate driver 120, the power supply 150, the boost converter 410 and a second discharging circuitry 420.

In this connection, each of the display panel 110 and the power supply 150 has the same configuration and function as those as described in FIG. 1. Thus, descriptions thereof are omitted.

The gate driver 120 may be implemented as a gate driver integrated circuit (GDIC). Hereinafter, in the second aspect of the present disclosure, the gate driver 120 is referred to as a 'GDIC 120'.

The boost converter 410 may supply an output voltage of a higher level than that of the input voltage of the power generated by the power supply 150. For example, the boost converter 410 may boost the 12V output voltage output from the PMIC 150 to 28 V voltage and output the 28 voltage as the gate high voltage VGH to the GDIC 120.

The boost converter 410 may be configured to include an inductance L, a diode D, and a capacitor C. In the boost converter 410, for example, the inductance L and the diode D may be connected in series to and disposed between the SWO terminal of the PMIC 150 and the connection line of the gate driver 120. The capacitor C may be connected in parallel to and disposed between a connection point b between the diode D and the gate driver 120 and the ground. The SWI terminal of the PMIC 150 may be connected to a connection point c between the inductance L and the diode D.

A boost mode may be activated to increase the luminance of the screen in bright outdoor environments, the product display modes, etc. In this case, in a mobile device or a wearable device to which the present disclosure is applied, the boost mode may be activated depending on an output of an illumination sensor when the use environment is bright or when a sample image is displayed in an exhibition hall. Therefore, according to the present disclosure, when it is necessary to increase the luminance locally on the screen or in a bright environment or the product display mode, the device may increase the luminance of the pixel PX to a level higher than that in a normal operation mode.

The boost mode may be embodied as an operation mode in which the luminance should be locally increased on the screen. A fingerprint sensing mode may be set as one of the boost modes. When using an optical fingerprint sensor, and when the luminance of the pixel PX used as a light source is increased to a higher luminance than that in the normal operation mode, an amount of light received by an image sensor may be increased, thereby improving the sensing sensitivity of the fingerprint pattern.

When a finger is touched on the screen of the display panel 110, the host system may generate a boost mode signal indicating the fingerprint sensing mode in response to the output signal of the touch sensor or pressure sensor. When the boost mode signal is input to the GDIC 120 from the host system, the GDIC 120 improves the pixel luminance of a fingerprint sensed area to a luminance level set in the boost mode, thereby turning on the fingerprint sensed area at a high luminance level.

The second discharging circuitry 420 may be connected to and disposed between the boost converter 410 and the GDIC 120, and may discharge charges remaining in the GDIC 120 to the ground GND when the power of the display panel 110 is off.

The second discharging circuitry 420 may include a resistor R connected to a connection point a between the boost converter 410 and the GDIC 120, and a thin-film transistor TFT having a drain terminal connected to the resistor R, and a source terminal connected to the ground.

Therefore, when the power of the display panel 110 is off, the thin-film transistor TFT of the second discharging circuitry 420 is turned on when the discharging control signal is applied to a gate terminal thereof. Thus, residual charges remaining on the GDIC 120 or the connection line of the GDIC 120 may flow to the ground GND through the resistor R, the drain terminal and the source terminal and thus may be discharged.

In one example, when the power of the display panel 110 is on, the thin-film transistor TFT of the second discharging circuitry 420 is turned off because the discharging control signal is not applied to the gate terminal thereof. Thus, the gate high voltage VGH signal from the boost converter 410 is input to the GDIC 120.

The second discharging circuitry 420 may increase or decrease the discharging time based on a magnitude of the resistor R value. In this connection, the magnitude of the resistor value may be adjusted by the main controller or an engineer in consideration of a FOS of the display panel 110 or a minimum discharging time as required.

Figure 5:
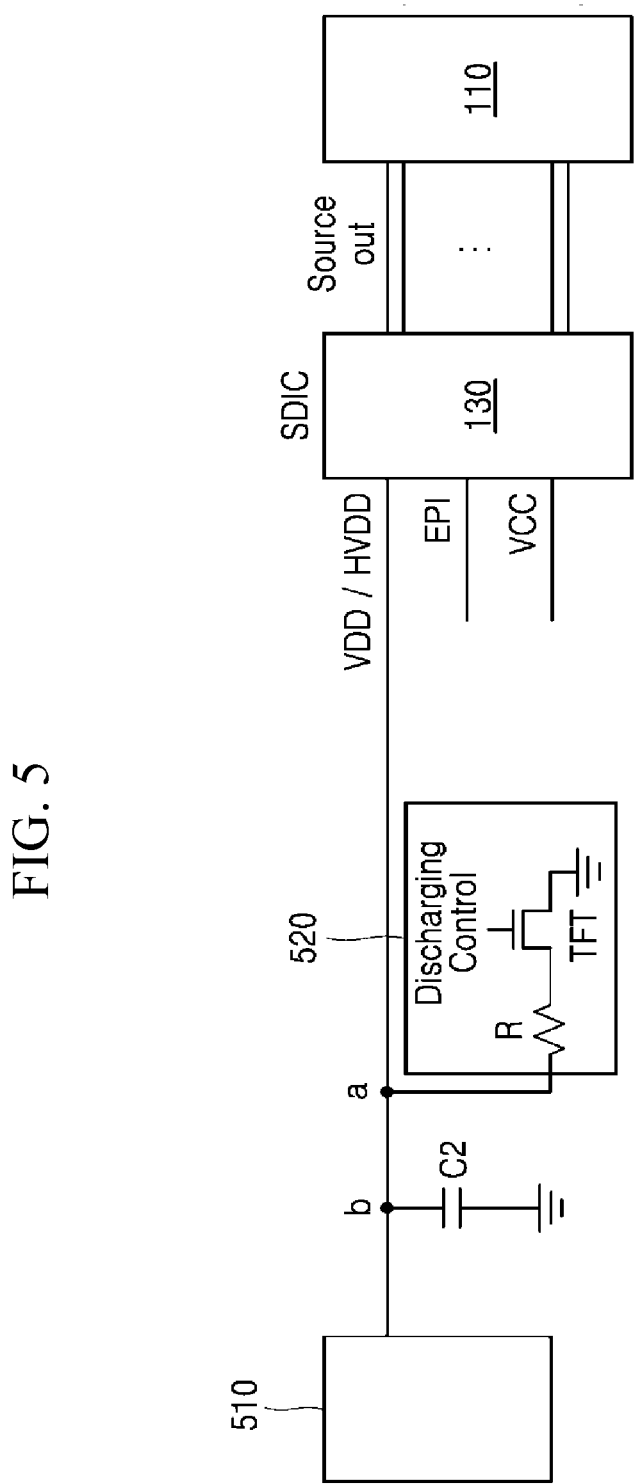
FIG. 5 is a schematic diagram showing a configuration of a display device capable of discharging residual charges according to a third aspect of the present disclosure.

FIG. 5 is a schematic diagram showing a configuration of a display device capable of discharging residual charges according to a third aspect of the present disclosure.

Referring to FIG. 5, a display device 100 capable of discharging residual charges according to the third aspect of the present disclosure may include a display panel 110, a data driver 130, a buck converter 510, and a third discharging circuitry 520.

In this connection, each of the display panel 110 and the data driver 130 has the same configuration and function as that as described in FIG. 1. Thus, descriptions thereof are omitted.

The data driver 130 may be implemented as a source driver integrated circuit (SDIC).

Hereinafter, in the third aspect of the present disclosure, the data driver 130 is referred to as the 'SDIC 130'.

The buck converter 510 may supply an output voltage of a level lower than that of the input voltage of the power applied from the PMIC 150. The PMIC 150 may include a switching circuit that generates a sequence control signal to control the output sequence of the buck voltages VCC1, VCC2, and VCC3, and a sequence control circuit to change the output sequence of the buck voltages VCC1, VCC2, and VCC3 according to the sequence control signal from the switching circuit SW, and output the changed sequence to the output terminal. The switching circuit may include a switching element which may be disposed between an input power VIN and the ground GND and allow the sequence control signal to be selected between the low and high level sequence control signals. The switching circuit may be connected to one of outer terminals of the PMIC 150 through the switching element. When the switching element may be connected to the input power VIN, a high level sequence control signal may be supplied from the switching circuit to a sequence control circuit. When the switching element may be connected to the ground GND, a low level sequence control signal may be supplied from the switching circuit to the sequence control circuit. In this connection, when the low level sequence control signal is supplied from the switching circuit SW to the sequence control circuit SWC, a sequence in which the buck voltages VCC1, VCC2, and VCC3 are output may be referred to as a first sequence. When the high level sequence control signal is supplied to the sequence control circuit, a sequence in which the buck voltages VCC1, VCC2, and VCC3 are output may be referred to as a second sequence.

The third discharging circuitry 520 may be connected to and disposed between the buck converter 510 and the data driver 130 to discharge the charges remaining in the data driver 130 to the ground GND when the display panel 110 is powered off.

The third discharging circuitry 520 may include a resistor R connected to connection point a between the SDIC 130 and the buck converter 510, and a thin-film transistor TFT having a drain terminal connected to the resistor R and a source terminal connected to the ground. SDIC 130 may receive an analog high-potential power voltage VDD and a mid(half)-potential power voltage HVDD from the buck converter 510. Also, the SDIC 130 may receive a DC power voltage VCC from the power supply 150 or an Embedded Panel Interface clock signal (EPI) from the timing controller 140.

Further, the capacitor C2 connected to the ground GND may be connected in parallel to a connection point b between the buck converter 510 and the connection point a of the third discharging circuitry 520.

Therefore, when the power of the display panel 110 is off, the thin-film transistor TFT of the third discharging circuitry 520 is turned on when a discharging control signal is applied to a gate terminal thereof. Thus, residual charges from the data driver 130 may flow to the ground GND through the resistor R, the drain terminal and the source terminal and thus may be discharged.

In this connection, the discharging time may be increased or decreased by adjusting the resistor value of the resistor R connected to the drain terminal of the thin-film transistor TFT.

Figure 6:
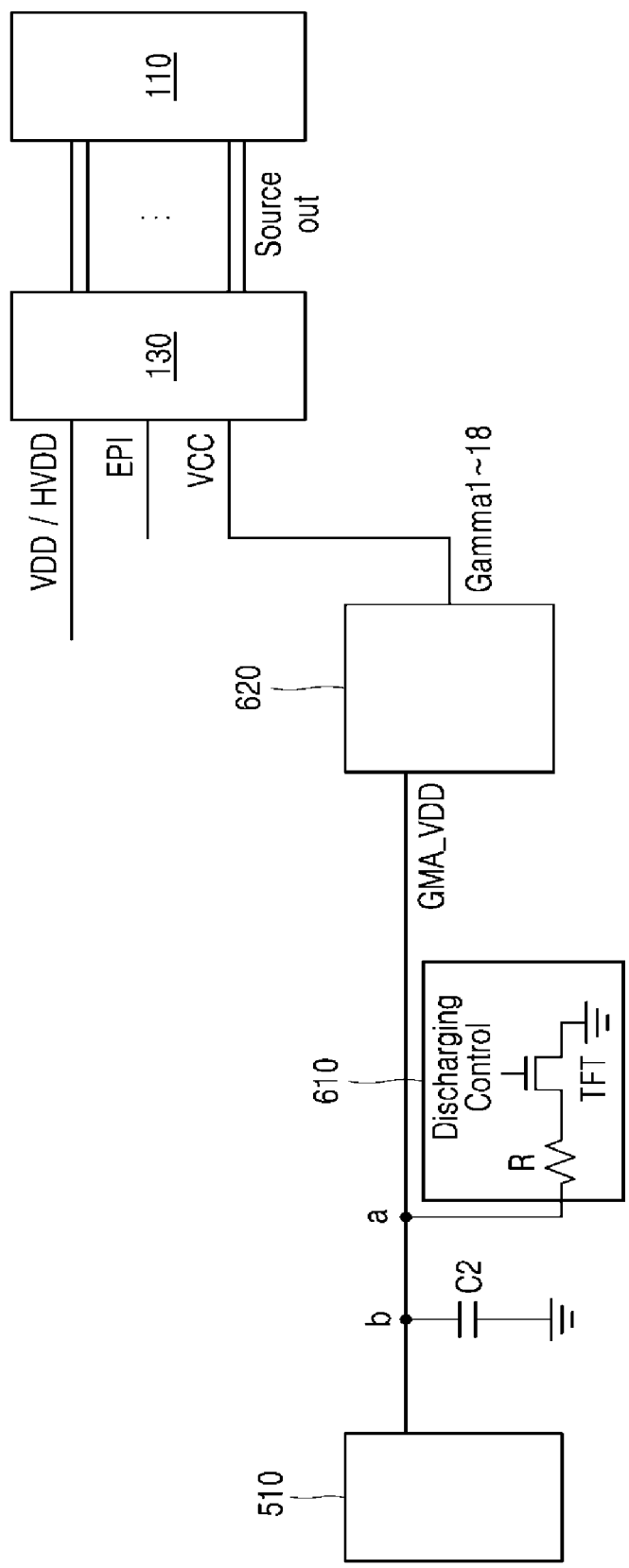
FIG. 6 is a schematic diagram showing a configuration of a display device capable of discharging residual charges according to a fourth aspect of the present disclosure.

FIG. 6 is a schematic diagram showing a configuration of a display device capable of discharging residual charges according to a fourth aspect of the present disclosure.

Referring to FIG. 6, a display device 100 capable of discharging residual charges according to an aspect of the present disclosure includes a display panel 110, a data driver 130, a buck converter 510, a fourth discharging circuitry 610, and a gamma integrated circuit (Gamma-IC) 620. Herein, the gamma integrated circuit (Gamma-IC) 620 may be referred to as a gamma voltage generator 620.

In this connection, each of the display panel 110 and the data driver 130 has the same configuration and function as that as described in FIG. 1. Thus, descriptions thereof are omitted. Further, the buck converter 510 has the same configuration and function as that as described in FIG. 5. Thus, descriptions thereof are omitted.

The fourth discharging circuitry 610 may be connected to and disposed between the gamma integrated circuit (Gamma-IC) 620 and the buck converter 510 to discharge charges remaining in the data driver 130 and the gamma integrated circuit (Gamma-IC) 620 to the ground when the display panel 110 is powered off. The data driver 130 may receive an analog high-potential power voltage VDD and a mid(half)-potential power voltage HVDD from the power supply 150. Also, the data driver 130 may receive a DC power voltage VCC from the gamma integrated circuit (Gamma-IC) 620 and an Embedded Panel Interface clock signal (EPI) from the timing controller 140.

The fourth discharging circuitry 610 may include a resistor R connected to a connection point a between the gamma voltage generator 620 and the buck converter 510, and a thin-film transistor TFT having a drain terminal connected to the resistor R and a source terminal connected to the ground.

Therefore, the thin-film transistor TFT of the fourth discharging circuitry 610 is turned on when a discharging control signal is applied to a gate terminal thereof when the display panel 110 is powered off. Thus, residual charges from the data driver 130 and the gamma voltage generator 620 may flow through the resistor R, the drain terminal and the source terminal to the ground GND and thus may be discharged.

In one example, in an normal operation of the display panel 110, while the power of the display panel 110 is on, the discharging control signal is not applied to the gate terminal of the thin-film transistor TFT of the fourth discharging circuitry 610, and thus the thin-film transistor TFT of the fourth discharging circuitry 610 turns off. Accordingly, the buck voltages VCC1, VCC2, and VCC3 from the buck converter 510 are input to a gamma reference voltage terminal GMA_VDD of the gamma voltage generator 620.

The gamma IC 620 generates a gamma reference voltage upon receiving an output voltage from the buck converter 510, and divides the gamma reference voltage using a voltage dividing circuit to generate a gray level-based gamma compensation voltage, and supplies the gray level-based gamma compensation voltage to the data driver 130.

The gamma IC 620 may include, for example, a common gamma generator and first to third gamma generators. The common gamma generator may generate first and second reference voltages.

The first reference voltage refers to a high potential reference voltage divided into a gamma compensation voltage V0 to V255 representing a first luminance range L1. The first luminance range L 1 refers to a luminance level of the input image rendered on the screen in the normal operation mode. The first and second reference voltages output from the common gamma generator may be commonly supplied to the first to third gamma generators.

The second reference voltage refers to a high potential reference voltage to generate a gamma compensation voltage V0 to V256 representing a second luminance range L2 in the boost mode. The second reference voltage may be set to a voltage higher than the first reference voltage.

The first luminance range L1 may be a luminance range of 2n gray levels that may be represented by n bit pixel data where n is a positive integer of 8 or greater. The second luminance range L2 may be a luminance range of 2n+1 gray levels that may be represented by n+1 bit pixel data. The highest luminance in the second luminance range L2 is higher than that in the first luminance range L1. The second luminance range L2 may render a locally bright image on the screen in a high luminance mode.

As described above, according to an aspect of the present disclosure, a power net includes the PMIC 150, the boost converter 310 or 410, the buck converter 510, the gamma IC 620, and the like. The discharging time may be adjusted through control of the resistor value of the resistor R connected to the thin-film transistor TFT, based on characteristics of an individual power net.

Figure 7:
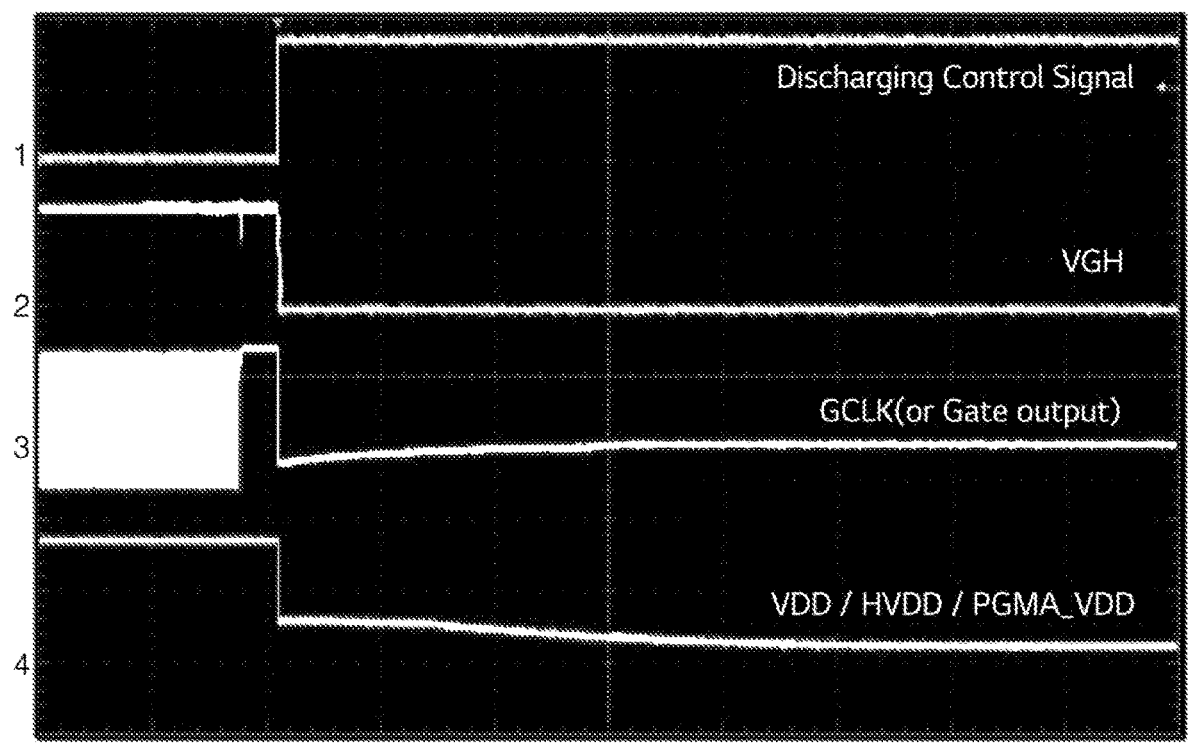
FIG. 7 is a graph in which a discharging time becomes short by setting a resistor value of a discharging circuitry to a small value according to an aspect of the present disclosure.

For example, in a power net in which the discharging time should be short in consideration of the characteristics of the individual power net, the resistor value of the discharging circuitry may be set to a minimum value as shown in FIG. 7, in consideration of the sequence, such that the discharging time becomes short. FIG. 7 is a drawing showing a graph in which the discharging time becomes short by setting the resistor value of the discharging circuitry to a small value according to an aspect of the present disclosure.

Figure 8:
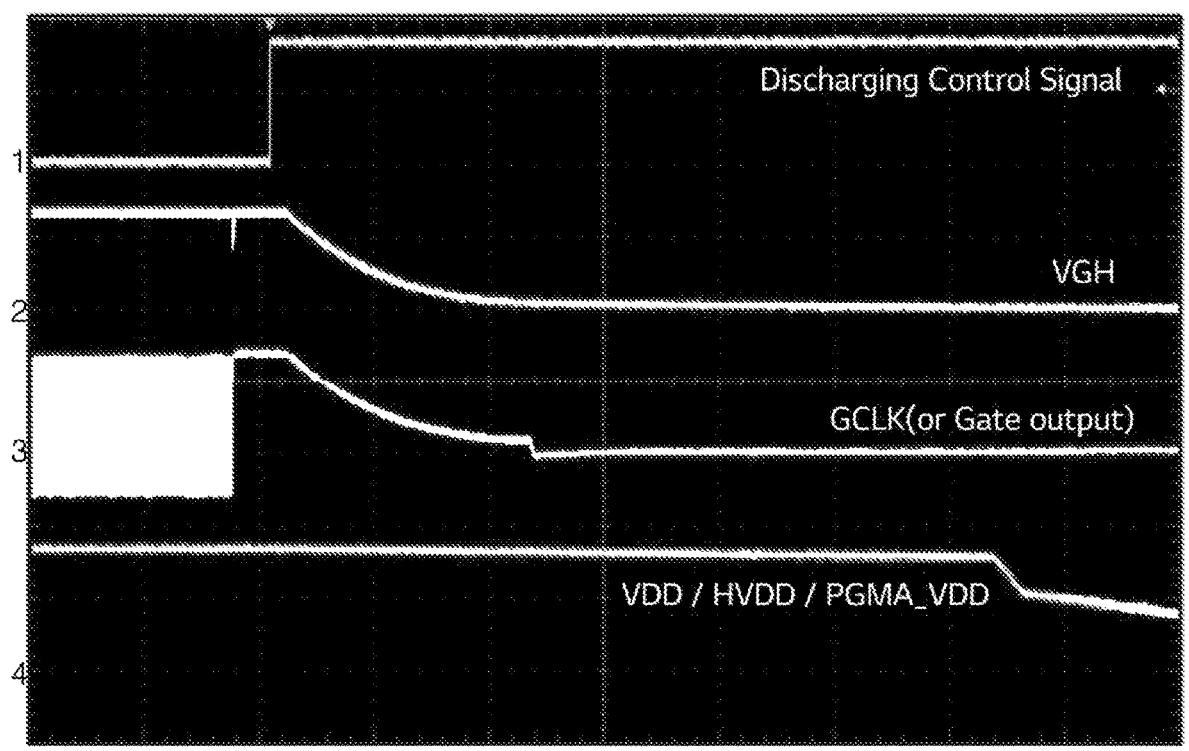
FIG. 8 is a graph in which a discharging time becomes large (open) by setting the resistor value of the discharging circuitry to a large value according to an aspect of the present disclosure.

Further, in a power net in which the discharging time should be large (open) in consideration of the characteristics of the individual power net, the resistor value of the discharging circuitry may be set to a maximum value as shown in FIG. 8, in consideration of the sequence, such that the discharging time becomes large. FIG. 8 is a drawing showing a graph in which the discharging time becomes large by setting the resistor value of the discharging circuitry to a large value according to an aspect of the present disclosure.

Figure 9:
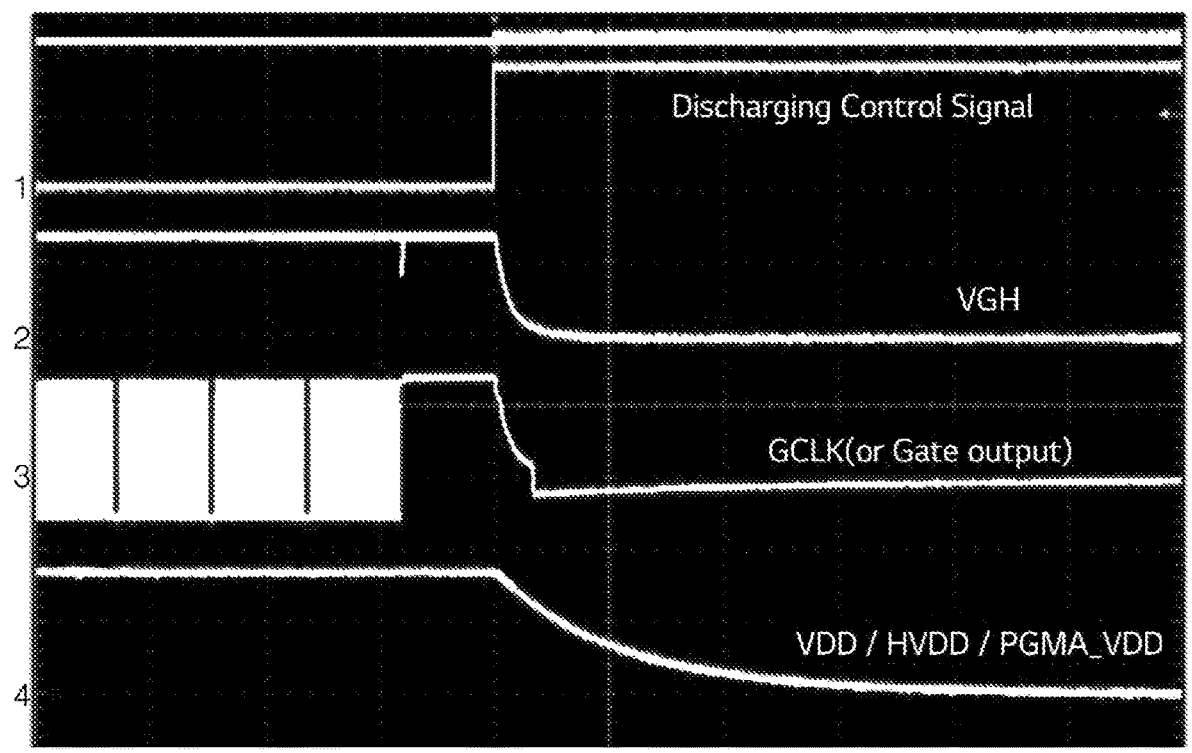
FIG. 9 is a graph in which the discharging time becomes optimal by optimizing the resistor value of the discharging circuitry according to an aspect of the present disclosure.

Further, in a power net in which the discharging time should be optimal in consideration of the characteristics of the individual power net, the resistor value of the discharging circuitry may be set to a middle value between the maximum value and the minimum value, as shown in FIG. 9, in consideration of the sequence, such that the discharging time becomes optimal. FIG. 9 is a drawing showing a graph in which the discharging time becomes optimal by optimizing the resistor value of the discharging circuitry according to an aspect of the present disclosure.

Therefore, according to an aspect of the present disclosure, the discharging time may be freely set by varying the resistor value of the discharging circuitry to the maximum value, the minimum value, and the middle value therebetween.

As described above, the present disclosure may provide the display device capable of discharging residual charges remaining in the gate driver, the data driver, the gamma voltage generator, etc. to the ground when the display panel is powered off.

A display device capable of discharging residual charges according to an aspect of the present disclosure may be described as follows.

A first aspect of the present disclosure may provide a display device capable of discharging residual charges, the device comprising: a display panel including a plurality of gate lines, a plurality of data lines, and a plurality of pixels; a timing controller configured to generate reference clocks and a start clock; a gate driver including: a level shifter configured to receive the reference clocks and the start clock from the timing controller to generates gate clocks; and a GIP (Gate In Panel) unit configured to generate gate pulses based on the gate clocks output from the level shifter, and to output the gate pulses to the plurality of gate lines; a power supply configured to generate power required for operation of the display panel; a boost converter configured to supply an output voltage of a level higher than a level of an input voltage of the power generated from the power supply; and a discharging circuitry connected to and disposed between the level shifter and the boost converter to discharge charges remaining in the level shifter to a ground when the display panel is powered off.

In one implementation of the first aspect, the discharging circuitry includes: a resistor connected to a connection point between the level shifter and the boost converter; and a thin-film transistor having a drain terminal connected to the resistor and a source terminal connected to the ground.

In one implementation of the first aspect, when the display panel is powered off, a discharging control signal is applied to a gate terminal of the thin-film transistor such that the thin-film transistor is turned on, and thus a gate high voltage signal from the level shifter is discharged to the ground through the resistor, the drain terminal, and the source terminal.

In one implementation of the first aspect, when the display panel is powered on, a discharging control signal is not applied to a gate terminal of the thin-film transistor such that the thin-film transistor is turned off, and thus, a gate high voltage signal from the boost converter is input to the level shifter.

In one implementation of the first aspect, the discharging circuitry increases or decreases a discharging time based on a magnitude of a value of the resistor.

A second aspect of the present disclosure may provide a display device capable of discharging residual charges, the device comprising: a display panel including a plurality of gate lines, a plurality of data lines, and a plurality of pixels; a gate driver for outputting a gate signal to the plurality of gate lines; a power supply configured to generate power required for an operation of the display panel; a boost converter configured to supply an output voltage of a level higher than a level of an input voltage of the power generated from the power supply; and a discharging circuitry connected to and disposed between the gate driver and the boost converter to discharge charges remaining in the gate driver to a ground when the display panel is powered off.

In one implementation of the second aspect, the discharging circuitry includes: a resistor connected to a connection point between the gate driver and the boost converter; and a thin-film transistor having a drain terminal connected to the resistor and a source terminal connected to the ground.

In one implementation of the second aspect, when the display panel is powered off, a discharging control signal is applied to a gate terminal of the thin-film transistor such that the thin-film transistor is turned on, and thus, residual charges from the gate driver are discharged to the ground through the resistor, the drain terminal, and the source terminal.

In one implementation of the second aspect, when the display panel is powered on, a discharging control signal is not applied to a gate terminal of the thin-film transistor such that the thin-film transistor is turned off, and thus, a gate high voltage signal from the boost converter is input to the gate driver.

A third aspect of the present disclosure may provide a display device capable of discharging residual charges, the device comprising: a display panel including a plurality of gate lines, a plurality of data lines, and a plurality of pixels; a gate driver for outputting a gate signal to the plurality of gate lines; a data driver for outputting a data signal to the plurality of data lines; a power supply configured to generate power required for an operation of the display panel; a buck converter configured to supply an output voltage of a level lower than a level of an input voltage of the power generated from the power supply; and a discharging circuitry connected to and disposed between the buck converter and the data driver to discharge charges remaining in the data driver to a ground when the display panel is powered off.

In one implementation of the third aspect, the discharging circuitry includes: a resistor connected to a connection point between the data driver and the buck converter; and a thin-film transistor having a drain terminal connected to the resistor and a source terminal connected to the ground.

In one implementation of the third aspect, when the display panel is powered off, a discharging control signal is applied to a gate terminal of the thin-film transistor such that the thin-film transistor is turned on, and thus, residual charges from the data driver are discharged to the ground through the resistor, the drain terminal, and the source terminal.

A fourth aspect of the present disclosure may provide a display device capable of discharging residual charges, the device comprising: a display panel including a plurality of gate lines, a plurality of data lines, and a plurality of pixels; a gate driver for outputting a gate signal to the plurality of gate lines; a data driver for outputting a data signal to the plurality of data lines; a power supply configured to generate power required for an operation of the display panel; a buck converter configured to supply an output voltage of a level lower than a level of an input voltage of the power generated from the power supply; a gamma voltage generator configured to: receive an output voltage from the buck converter to generate a gamma reference voltage; divide the gamma reference voltage using a voltage dividing circuit to generate a gray level-based gamma compensation voltage; and supply the gray level-based gamma compensation voltage to the data driver; and a discharging circuitry connected to and disposed between the buck converter and the gamma voltage generator to discharge charges remaining in the data driver and the gamma voltage generator to a ground when the display panel is powered off.

In one implementation of the fourth aspect, the discharging circuitry includes: a resistor connected to a connection point between the gamma voltage generator and the buck converter; and a thin-film transistor having a drain terminal connected to the resistor and a source terminal connected to the ground.

In one implementation of the fourth aspect, when the display panel is powered off, a discharging control signal is applied to a gate terminal of the thin-film transistor such that the thin-film transistor is turned on, and thus, residual charges from the data driver and the gamma voltage generator are discharged to the ground through the resistor, the drain terminal, and the source terminal.

Although the aspects of the present disclosure have been described in more detail with reference to the accompanying drawings, the present disclosure is not necessarily limited to these aspects. The present disclosure may be implemented in various modified manners within the scope not departing from the technical idea of the present disclosure. Accordingly, the aspects disclosed in the present disclosure are not intended to limit the technical idea of the present disclosure, but to describe the present disclosure. the scope of the technical idea of the present disclosure is not limited by the aspects. Therefore, it should be understood that the aspects as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:
1. A display device capable of discharging residual charges, the display device comprising:
 a display panel including a plurality of gate lines, a plurality of data lines and a plurality of pixels;
 a timing controller configured to generate reference clocks and a start clock;
 a gate driver including:
  a level shifter configured to receive the reference clocks and the start clock from the timing controller to generates gate clocks; and a gate in panel (GIP) unit configured to generate gate pulses based on the gate clocks output from the level shifter, and to output the gate pulses to the plurality of gate lines;
a power supply configured to generate power required for operation of the display panel;
a boost converter configured to supply an output voltage of a level higher than a level of an input voltage of the power generated from the power supply;
a discharging circuitry connected to and disposed between the level shifter and the boost converter to discharge charges remaining in the level shifter to a ground when the display panel is powered off,
wherein the discharging circuitry includes:
  a resistor connected to a connection point between the level shifter and the boost converter; and
  a thin-film transistor having a drain terminal connected to the resistor and a source terminal connected to the ground, and
wherein, when the display panel is powered off, a discharging control signal is supplied to a gate terminal of the thin-film transistor such that the thin-film transistor is turned on, and thus a gate high voltage signal from the level shifter is discharged to the ground through the resistor, the drain terminal and the source terminal.

2. The display device of claim 1, wherein, when the display panel is powered on, a discharging control signal is not supplied to a gate terminal of the thin-film transistor such that the thin-film transistor is turned off, and thus a gate high voltage signal from the boost converter is input to the level shifter.

3. The display device of claim 1, wherein the discharging circuitry increases or decreases a discharging time based on a magnitude of a value of the resistor.

4. A display device capable of discharging residual charges, the display device comprising:
a display panel including a plurality of gate lines, a plurality of data lines and a plurality of pixels;
a gate driver configured to output a gate signal to the plurality of gate lines;
a power supply configured to generate power required for an operation of the display panel;
a boost converter configured to supply an output voltage of a level higher than a level of an input voltage of the power generated from the power supply;
a discharging circuitry connected to and disposed between the gate driver and the boost converter to discharge charges remaining in the gate driver to a ground when the display panel is powered off,
wherein the discharging circuitry includes:
  a resistor connected to a connection point between the level shifter and the boost converter; and
  a thin-film transistor having a drain terminal connected to the resistor and a source terminal connected to the ground, and
wherein, when the display panel is powered off, a discharging control signal is supplied to a gate terminal of the thin-film transistor such that the thin-film transistor is turned on, and thus a gate high voltage signal from the level shifter is discharged to the ground through the resistor, the drain terminal and the source terminal.

5. The display device of claim 4, wherein, when the display panel is powered on, a discharging control signal is not supplied to a gate terminal of the thin-film transistor such that the thin-film transistor is turned off, and thus a gate high voltage signal from the boost converter is input to the gate driver.

6. A display device capable of discharging residual charges, the display device comprising:
a display panel including a plurality of gate lines, a plurality of data lines, and a plurality of pixels;
a gate driver configured to output a gate signal to the plurality of gate lines;
a data driver configured to output a data signal to the plurality of data lines;
a power supply configured to generate power required for an operation of the display panel;
a buck converter configured to supply an output voltage of a level lower than a level of an input voltage of the power generated from the power supply;
a discharging circuitry connected to and disposed between the buck converter and the data driver to discharge charges remaining in the data driver to a ground when the display panel is powered off,
wherein the discharging circuitry includes:
  a resistor connected to a connection point between the data driver and the buck converter; and
  a thin-film transistor having a drain terminal connected to the resistor and a source terminal connected to the ground, and
wherein, when the display panel is powered off, a discharging control signal is applied to a gate terminal of the thin-film transistor such that the thin-film transistor is turned on, and thus residual charges from the data driver are discharged to the ground through the resistor, the drain terminal, and the source terminal.

7. A display device capable of discharging residual charges, the display device comprising:
a display panel including a plurality of gate lines, a plurality of data lines, and a plurality of pixels;
a gate driver configured to output a gate signal to the plurality of gate lines;
a data driver configured to output a data signal to the plurality of data lines;
a power supply configured to generate power required for an operation of the display panel;
a buck converter configured to supply an output voltage of a level lower than a level of an input voltage of the power generated from the power supply;
a gamma voltage generator configured to:
  receive the output voltage from the buck converter to generate a gamma reference voltage;
  divide the gamma reference voltage using a voltage dividing circuit to generate a gray level-based gamma compensation voltage; and
  supply the gray level-based gamma compensation voltage to the data driver; and
a discharging circuitry connected to and disposed between the buck converter and the gamma voltage generator to discharge charges remaining in the data driver and the gamma voltage generator to a ground when the display panel is powered off,
wherein the discharging circuitry includes:
  a resistor connected to a connection point between the gamma voltage generator and the buck converter; and
  a thin-film transistor having a drain terminal connected to the resistor and a source terminal connected to the ground, and
wherein, when the display panel is powered off, a discharging control signal is applied to a gate terminal of the thin-film transistor such that the thin-film transistor is turned on, and thus residual charges from the data driver and the gamma voltage generator are discharged to the ground through the resistor, the drain terminal, and the source terminal.

* * * * *